United States Patent

Mueller et al.

Patent Number: 5,463,314
Date of Patent: Oct. 31, 1995

[54] GAUGE WITH MAGNETICALLY FIXED REST POSITION

[75] Inventors: Thomas R. Mueller, Swartz Creek; Gail M. Sylvester, Frankenmuth, both of Mich.

[73] Assignee: Delco Electronics Corporation, Kokomo, Ind.

[21] Appl. No.: 187,024

[22] Filed: Jan. 27, 1994

[51] Int. Cl.⁶ .............................. G01R 35/00; G01R 1/38; G01D 11/08
[52] U.S. Cl. ............................................... 324/146
[58] Field of Search .................... 73/866.1, 1 R; 116/204; 324/146, 151 R, 152, 151 A

[56] References Cited

U.S. PATENT DOCUMENTS

| | | | |
|---|---|---|---|
| Re. 28,297 | 1/1975 | Void | 324/146 |
| Re. 32,604 | 2/1988 | Reenstra | 324/146 |
| 2,350,741 | 6/1944 | Ford | 73/866.1 X |
| 2,358,910 | 9/1944 | De Giers | 324/146 X |
| 2,747,045 | 5/1956 | Parmer | 324/146 |
| 2,817,816 | 12/1957 | Medlar | 324/146 X |
| 3,636,447 | 1/1972 | Gelenius | 324/146 X |
| 3,961,244 | 6/1976 | Minchom | 324/216 |
| 4,724,601 | 2/1988 | MacManus et al. | 324/146 X |
| 4,727,279 | 2/1988 | Peng | 73/35 X |
| 5,323,639 | 6/1994 | Komurasaki et al. | 73/35 |

*Primary Examiner*—Thomas P. Noland
*Attorney, Agent, or Firm*—Jimmy L. Funke

[57] ABSTRACT

An air core gauge for an instrument cluster includes a permanent magnet armature and field coils energized according to an input parameter determine the position of the armature and a pointer connected to the armature. Terminal pins outboard of the armature carry energizing current to the coils. One of the terminal pins is made of ferrous material to magnetically attract the armature to a rest position when energizing current is off.

6 Claims, 1 Drawing Sheet

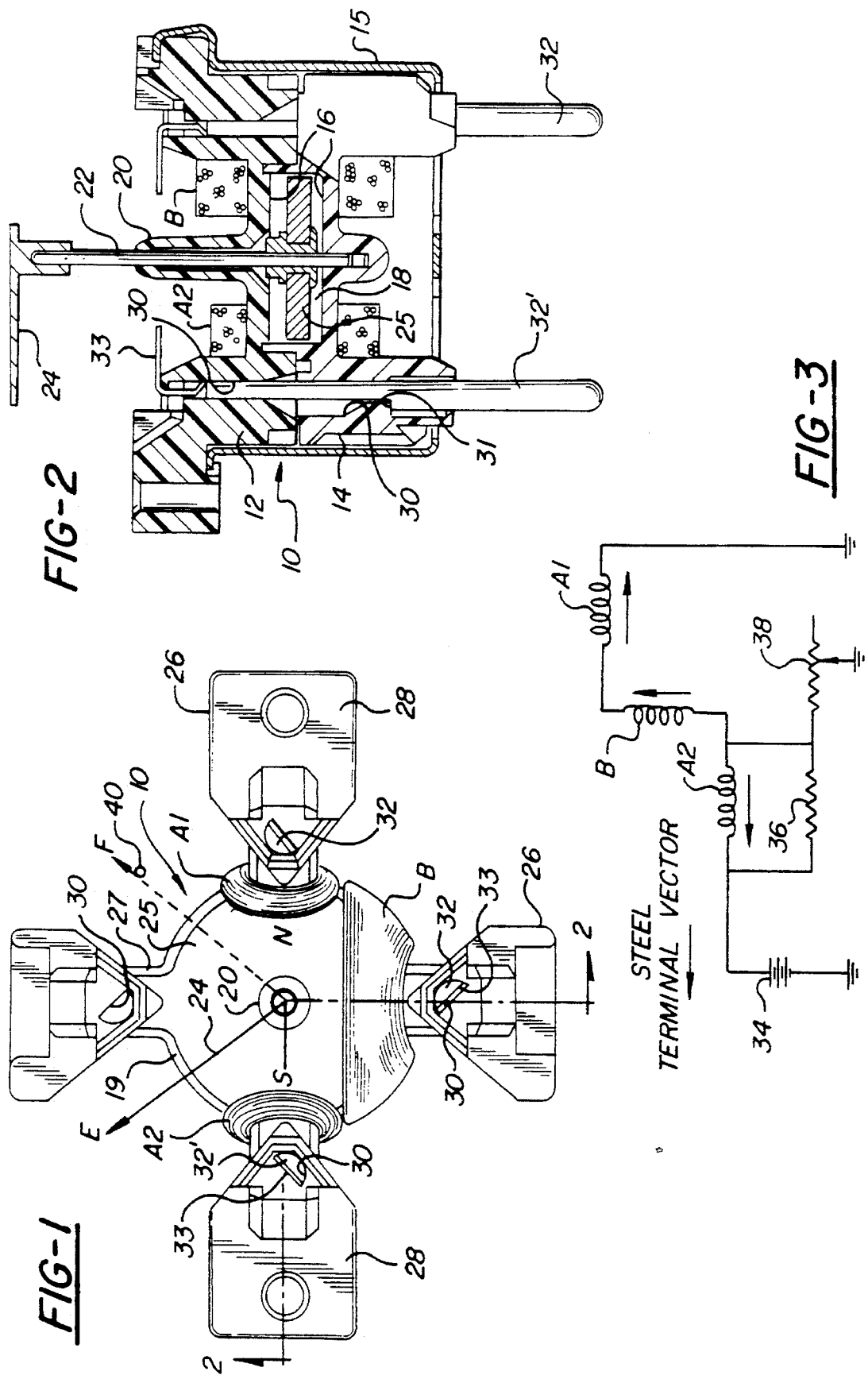

GAUGE WITH MAGNETICALLY FIXED REST POSITION

FIELD OF THE INVENTION

This invention relates to instrument gauges and particularly to such gauges having a fixed rest position.

BACKGROUND OF THE INVENTION

Automotive gauges commonly use an air core movement involving a permanent magnet armature and electrical coils for positioning the armature and an associated pointer according to the value of on input parameter. The input parameter is provided by an input control comprising a temperature sensor, a fuel level sender, etc. A gauge circuit having terminals for battery voltage, ground, and the input control varies the energization of the coils in a manner to produce a resultant magnetic vector which positions the pointer in accordance with the parameter value.

Unless special provision is made, such gauges have no position preference when the gauge energization is turned off, and the pointer will float or remain in its position at the time the circuit is disabled. This condition is aesthetically undesirable since it may give the impression that the gauge is operating incorrectly. A position preference can be provided, however, to establish a "zero" position or rest position, which may be the same as the zero value (or the lowest value) of the input parameter.

It has been proposed to add components to such a gauge to cause the pointer to automatically seek a rest position when the circuit is deenergized. For example it is possible to attach a magnet to some portion of the gauge structure to attract the pointer or the gauge armature to the rest position. Any such addition to the gauge adds expense to the manufacture of the gauge since both the extra component and the process of assembling it involve extra expense.

SUMMARY OF THE INVENTION

It is therefore an object of the invention to establish a fixed rest position of a gauge pointer without added components in the gauge assembly.

A conventional air core gauge has a permanent magnet armature driving a pointer, a number of coils around the armature, and a gauge circuit for energizing the coils according to an input parameter, so that the pointer is moved to indicate the parameter value. Connections of the circuit to a voltage source and to the parameter input are made via terminals which conveniently attach to a printed circuit board carrying the necessary voltages. The terminals usually are of brass or other common electrical conductor. To achieve a fixed rest position of the pointer when electrical input is removed from the circuit, one of the terminals is made of ferrous material and positioned to attract the permanent magnet to the desired rest position. Thus no extra components are needed to add the function, but only a material change is necessary.

BRIEF DESCRIPTION OF THE DRAWINGS

The above and other advantages of the invention will become more apparent from the following description taken in conjunction with the accompanying drawings wherein like references refer to like parts and wherein:

FIG. 1 is a top view of an air core gauge according to the invention;

FIG. 2 is a cross-sectional view of the gauge taken along line 2—2 of FIG. 1; and FIG. 3 is a schematic diagram of a gauge circuit according to the invention.

DESCRIPTION OF THE INVENTION

Referring to FIGS. 1 and 2, an air core gauge of the type used to drive pointers in automotive instrument clusters comprises a bobbin 10 having an upper section 12 and a lower section 14 of molded polymer. A metallic housing 15 partially surrounding the bobbin and crimped onto the bobbin to provide a magnetic shield. The sections each have a central recess 16 adjacent a mating surface and when the two sections are joined, the recesses 16 define an armature cavity 18 within a cylindrical housing 19 having an axial axis. Each section has a hollow axial hub 20 protruding outwardly to form a bearing and support for a gauge spindle 22. The hole in the upper section hub extends through the hub, allowing the spindle to extend outside the bobbin. A pointer 24 is mounted on the top end of the spindle. An annular permanent magnet 25 in the cavity 18 is secured to the spindle 22 to angularly position the spindle 22 and pointer 24. The magnet 25 is magnetized to produce a north pole and a south pole at diametrically opposite points on the magnet periphery.

The bobbin 10 has four equally spaced posts 26 each extending parallel to the spindle axis and arranged outboard of the armature cavity 18, connected to the cylindrical housing 19 by neck portions 27. Two opposed posts 26 have upper mounting lugs 28 for fastening the gauge to a support and dial, not shown. Each of the posts has an axial hole 30 to receive a terminal pin 32 or 32' for electrically connecting the gauge to a printed circuit board. Only three pins are needed and the fourth hole 30 remains vacant. Each pin has a D-shaped upper portion fitting into a matching hole 30 in the upper section 12, and terminating in a flexible flat tab 33 for attachment to coil leads. The tab 33 is shown bent over in FIG. 2 and upright in FIG. 1. The lower section of each pin is cylindrical, fitting into the hole 30 of the lower section 14 and extending out for connection to the circuit board. Barbs, not shown, on the upper section of each pin hold the pin in place. A shoulder 31 at the top of the cylindrical lower section abuts a mating shoulder in the hole 30 to hold the two bobbin section together. As thus far described, the gauge structure is well known in the art and needs no further explanation. In the prior art, the three terminal pins are identical and comprise a non-ferrous conductive material. Here, the pins have the same configuration and two of the terminal pins 32 are nonferrous; the third pin 32' is made of magnetic ferrous material such as steel. In particular, it is required that the pin 32' be able to attract a pole of the magnet 25 so that, in the absence of any other magnetic force, the magnet and pointer are urged toward a zero or rest position.

The gauge windings comprise three coils. A first coil A2 is wound around the neck 27 adjacent the ferrous terminal 32' so that it is physically aligned with the terminal 32' and its magnetic field, when energized, is in the same direction as the attraction or vector of the terminal 32' to drive the magnet to the rest position. A second coil A1 is wound around the neck 27 opposite the coil A2; those coils are essentially the same size but with opposed coil sense so that the fields are opposed. The third coil B is wound around the neck of a post between the two A coils so that it produces a vector at right angles to the A1 and A2 vectors, to move the magnet away from the rest position as the B and A1 vectors increase.

The gauge circuit, as shown in FIG. 3, comprises the coil A2, the coil B, and the coil A1 serially connected between a battery 34 and ground. A calibration resistor 36 is connected in parallel with the coil A2, and a variable resistor 38 is coupled between ground and the junction of coils A2 and B. The variable resistor 38 is the circuit input and varies according to some parameter such as fuel level, pressure or temperature, for example. The resistor 38 preferably varies between 1 ohm for one extreme value of the parameter and 88 ohms for the other extreme. The 1 ohm setting may for example correspond to zero fuel level. At that low value the current through the coil A2 is maximum and the current through coils A1 and B is minimum to drive the magnet and pointer to zero position. As the resistor 38 value increases, the gauge circuit simultaneously increases the current in the A1 coil and the B coil and decreases the current in the A2 coil so that the result is to reduce or nullify the attraction to the rest position while increasing the vector in the B direction. When the energizing current is removed from the gauge coils the only remaining attractive force is that between the magnet and the ferrous terminal 32' The pointer range is shown in FIG. 1 for a fuel gauge application for movement between E and F positions. When the north pole of the magnet 25 is adjacent the ferrous terminal 32', the pointer is at the E position (the rest position), and as the magnet rotates clockwise the pointer moves toward the F position.

While the attraction of the ferrous terminal 32' is sufficient to urge the magnet and the pointer to rest position, it is about one tenth the strength of the attraction imposed by the B coil when fully energized. Thus the ferrous terminal offers only minor distortion to the response of the magnet position to the changing resistance 38, and if desired moderate coil changes can be made to offset such distortion. Since both the north and south magnetic poles are attracted to the ferrous terminal, the range of the pointer movement must be less than 90 degrees to insure correct pointer rotation when the power is removed. A pointer stop 40 is useful to maintain the pointer in the proper range of movement.

It will be apparent that other gauge configuration can take advantage of the ferrous terminal pin for maintaining a zero position. Instead of the 90 degrees separation of the three coils, a 120 degree separation can be used, for example. Still other gauge variations using the same concept will be apparent to those skilled in the art. In any event, the additional function of maintaining a power off rest position is achieved using standard terminal pin configurations, requiring merely a change of material of one of the pins.

The embodiments of the invention in which an exclusive property or privilege is claimed are defined as follows:

1. An air core gauge for moving a pointer to an indicating position dependent on electrical input, the pointer having a rest position in the absence of electrical input, comprising:
   a permanent magnet in the form of an armature attached to the pointer and mounted for rotation about an axis;
   a gauge circuit having a plurality of coils for establishing a magnetic field around the armature, whereby the magnetic field determines pointer position when the circuit is energized and the rotation of the pointer is restricted to less than 90 degrees from the rest position; and
   a plurality of terminals coupled to the gauge circuit for carrying an electrical input to energize the circuit, one of the terminals comprising ferrous material and positioned to attract the magnet and always move the pointer to the rest position in the absence of the electrical input.

2. An air core gauge as described in claim 1 wherein the attraction of the magnet to the ferrous terminal is insufficient to substantially affect the pointer position when the circuit is energized.

3. An air core gauge as described in claim 1 wherein the electrical input is dependent on a parameter, and the pointer is set to the rest position when the parameter is at a zero value.

4. An air core gauge for moving a pointer to an indicating position dependent on electrical input, the pointer having a rest position in the absence of electrical input, comprising:
   a permanent magnet in the form of an armature attached to the pointer and mounted for rotation about an axis;
   a gauge circuit having three coils angularly spaced around the axis for establishing a magnetic field around the armature, whereby the magnetic field determines pointer position when the circuit is energized; and
   a plurality of terminals coupled to the gauge circuit for carrying electrical input to energize the circuit, one of the terminals comprising ferrous material and positioned to attract the magnet and move the pointer to the rest position in the absence of an electrical input, wherein the one terminal comprising ferrous material is aligned with one of the coils for establishing the rest position in line with the one coil.

5. An air core gauge for moving a pointer to an indicating position dependent on electrical input, the pointer having a rest position in the absence of electrical input, comprising:
   a permanent magnet in the form of an armature attached to the pointer and mounted for rotation about an axis;
   a gauge circuit having three coils angularly spaced around the axis for establishing a magnetic field around the armature, wherein the magnetic field determines pointer position when the circuit is energized and one of the coils, when fully energized produces a magnetic field vector for moving the pointer to the rest position; and
   a plurality of terminals coupled to the gauge circuit for carrying electrical input to energize the circuit, one of the terminals comprising ferrous material and positioned to attract the magnet and move the pointer to the rest position in the absence of an electrical input, wherein the one terminal comprising ferrous material is aligned with the one coil.

6. An air core gauge for moving a pointer to an indicating position dependent on electrical input, the electrical input being dependent a value of a parameter, the pointer having a rest position in the absence of electrical input, comprising:
   a permanent magnet in the form of an armature attached to the pointer and mounted for rotation about an axis;
   a gauge circuit having a plurality of coils for establishing a magnetic field around the armature, whereby the magnetic field determines pointer position when the circuit is energized; and
   a plurality of terminals coupled to the gauge circuit for carrying electrical input to energize the circuit, one of the terminals comprising ferrous material and positioned to attract the magnet and move the pointer to the rest position in the absence of an electrical input;
   wherein the circuit energizes primarily one coil when the parameter is at an extreme value to produce a magnetic field vector effective to move the pointer to the rest position;
   the ferrous terminal being aligned with the one coil; and
   at least another coil is energized to produce another field vector of increasing magnitude when the parameter changes toward another extreme value.

* * * * *